(12) United States Patent
Oshima et al.

(10) Patent No.: US 6,228,234 B1
(45) Date of Patent: May 8, 2001

(54) APPARATUS FOR SPUTTERING

(75) Inventors: Yoshihiro Oshima, Gifu; Masayasu Kakinuma, Kanagawa, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/222,346

(22) Filed: Dec. 29, 1998

(30) Foreign Application Priority Data

Jan. 5, 1998 (JP) .................................................. 10-000029

(51) Int. Cl.$^7$ .................................................. C23C 14/34
(52) U.S. Cl. .................. 204/298.07; 204/298.26
(58) Field of Search ................ 204/298.07, 298.16, 204/298.19, 298.26, 298.12; 427/255.5; 118/728

(56) References Cited

U.S. PATENT DOCUMENTS

| | | | |
|---|---|---|---|
| 5,130,170 | * | 7/1992 | Kanai et al. ...................... 427/255.5 |
| 5,318,633 | * | 6/1994 | Yamamoto et al. ................. 118/728 |
| 5,798,029 | * | 8/1998 | Morita .............................. 204/298.07 |

FOREIGN PATENT DOCUMENTS

| | | | |
|---|---|---|---|
| 2-213468 | * | 8/1990 | (JP) ................................. 204/298.07 |
| 55-230640 | * | 9/1993 | (JP) ................................. 204/298.07 |
| 5-320891 | * | 12/1993 | (JP) ................................. 204/298.07 |

* cited by examiner

*Primary Examiner*—Nam Nguyen
*Assistant Examiner*—Gregg Cantelmo
(74) *Attorney, Agent, or Firm*—Ronald P. Kananen; Rader, Fishman & Grauer

(57) ABSTRACT

The invention provides an apparatus for sputtering, with which it is easy to control gas flow rate in a short time, and relates to an apparatus for sputtering in which reactive gas is supplied to a gas distributor having a plurality of gas nozzles provided in a vacuum chamber, the reactive gas is jetted from the gas nozzles, and a gauge port type connector for detaching the gas distributor is provided in the vacuum chamber. The gas nozzles comprise screws, each screw has a hole for jetting reactive gas and is directed in the outside direction of the chamber. Therefore, it is possible to change the gas flow rate easily in a short time.

12 Claims, 4 Drawing Sheets

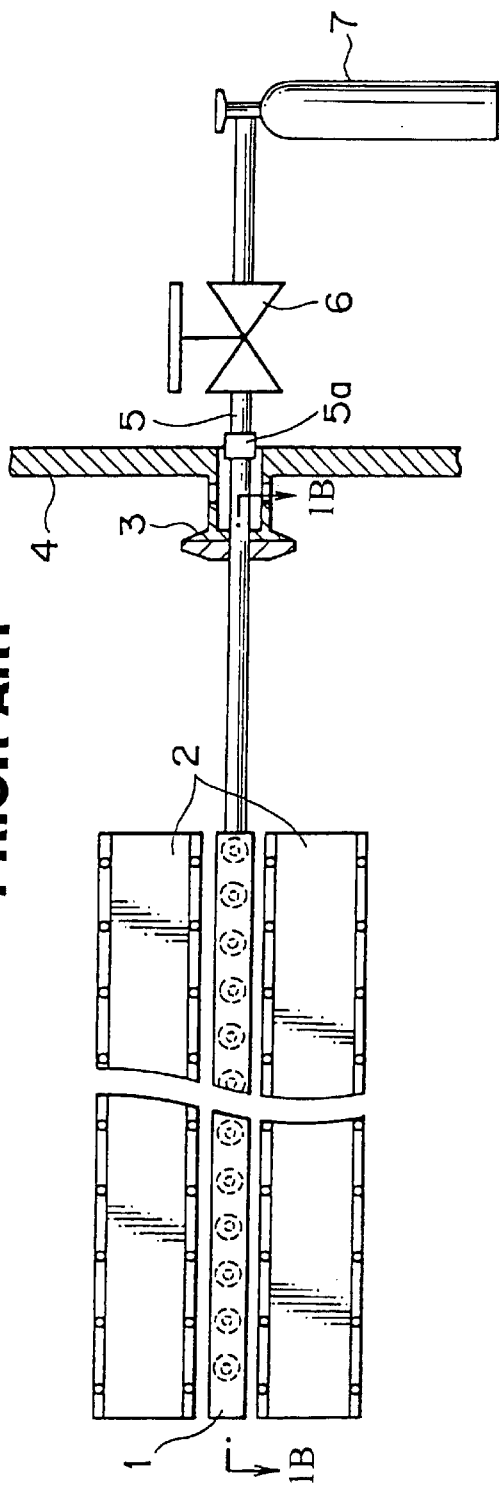
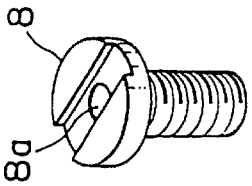
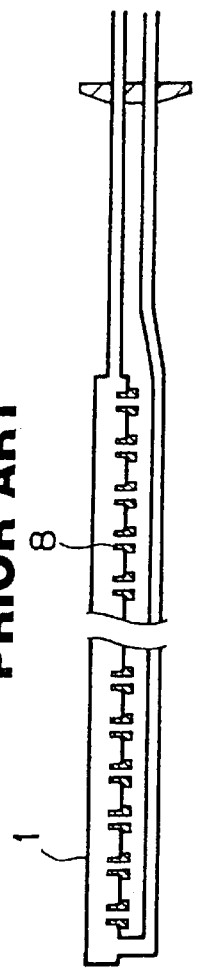

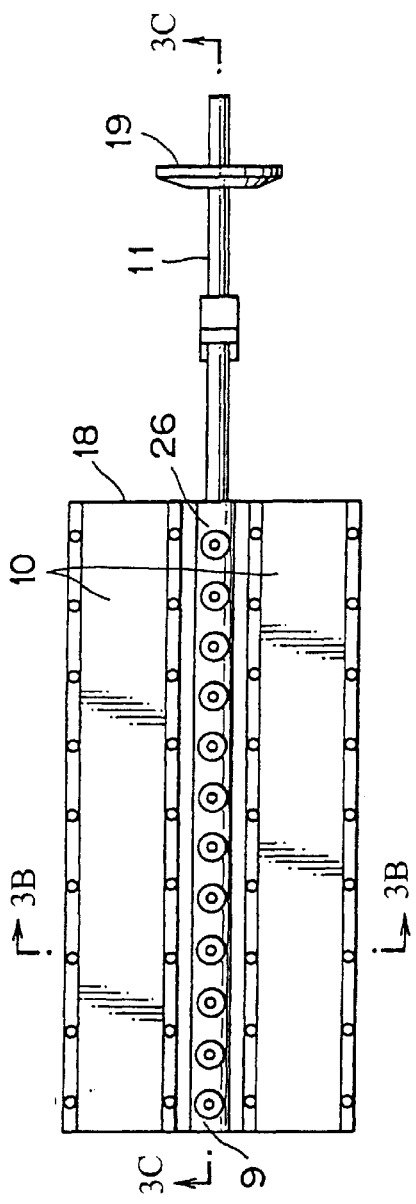
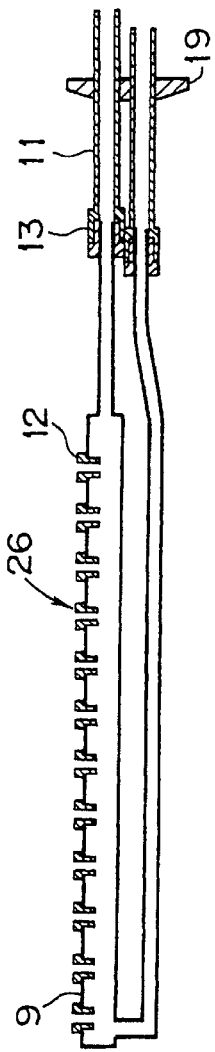
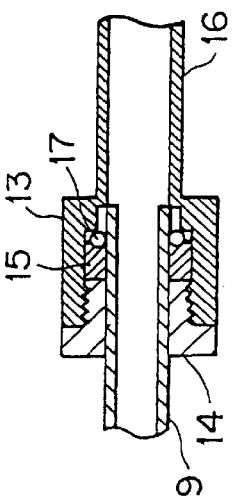
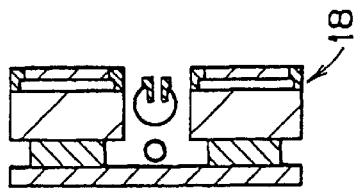

F I G. 4
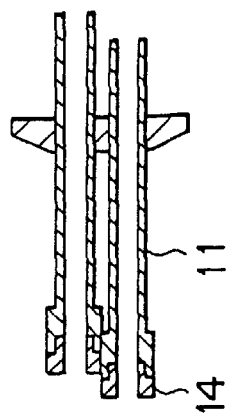
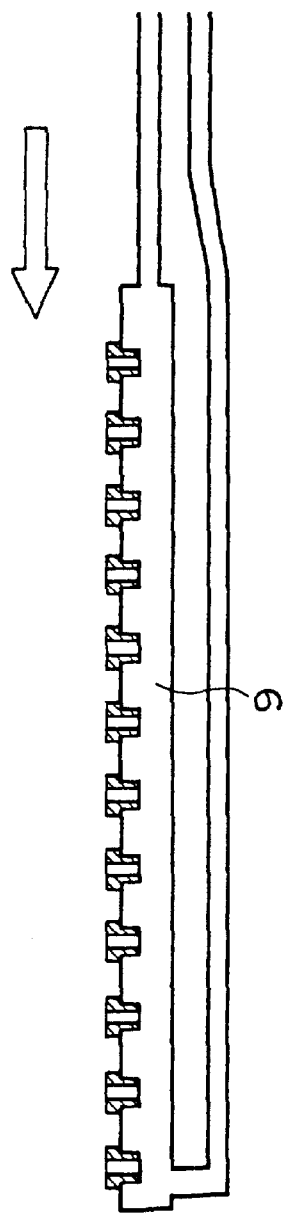

APPARATUS FOR SPUTTERING

BACKGROUND OF THE INVENTION

This invention relates to an apparatus for sputtering provided with a reactive gas jetting pipe for supplying reactive gas into the pipe having a plurality of gas nozzles provided in a chamber and for jetting the reactive gas from the gas nozzles.

DESCRIPTION OF RELATED ART

FIG. 1A is a plan view for illustrating schematically a reactive gas jetting pipe of a conventional apparatus for sputtering, FIG. 1B is a cross sectional view along the line 1B—1B shown in FIG. 1A, and FIG. 1C is a perspective enlarged view of the gas nozzle shown in FIG. 1B.

As shown in FIGS. 1A and 1B, the reactive gas jetting pipe 1 is connected to a vacuum chamber outer wall 4 through an in-vacuum chamber connector 3. The in-vacuum chamber connector 3 is connected to a gas pipe 5 through an out-vacuum chamber connector gas pipe connector 5a, and the gas pipe 5 is connected to a reactive gas cylinder 7 through a reactive gas flow rate control valve 6.

The reactive gas pipe 1 is located between targets 2, and thirty metal gas nozzles 8 are provided downward with respect to the pipe (in the direction opposite to the target front side). The gas nozzles are formed in a screw shape as shown in FIG. 1C, and a hole 8a for guiding gas is provided through from the base of a screw to the top. Gas flow rate jetted from the hole 8a is controlled by adjusting the size of the hole 8a to a suitable size. Thereby, gas flow rate in the longitudinal direction of the reactive gas pipe 1 is controlled, and the evenness of the film thickness of sputtering film is secured.

As described herein above, the reactive gas jetting pipe 1 has gas nozzles 8 provided downward as shown in FIG. 1B. In other words, the gas nozzles 8 are disposed on the back side of the reactive gas pipe 1. In addition, the reactive gas pipe 1 is fixed to the chamber outside wall 4 through the in-vacuum chamber connector 3 and the out-vacuum chamber gas pipe connector 5a. To replace or adjust the gas nozzles 8, it is required to detach the in-vacuum chamber connector 3 and the out-vacuum chamber gas pipe connector 5a and to take out the reactive gas pipe 1 completely outside the vacuum chamber, because the reactive gas pipe 1 is combined solidly with base which fixes the reactive gas pipe 1. Therefore, it takes a very long time to adjust the gas nozzles 8.

OBJECT AND SUMMARY OF THE INVENTION

The present invention has been accomplished in view of the above-mentioned problem, and it is the object of the present invention to provide an apparatus for sputtering in which gas flow rate is adjustable easily and quickly.

To solve the above-mentioned problem, the apparatus for sputtering in accordance with the present invention is an apparatus for sputtering in which reactive gas is supplied to a pipe having a plurality of gas nozzles provided in a chamber and the reactive gas is jetted from the gas nozzles, wherein a connector for detaching the pipe is provided in the chamber. An above-mentioned gas nozzles preferably comprise a screw, each screw has a hole for jetting reactive gas.

A plurality of gas nozzles with hole diameter distribution are prepared previously, and the gas nozzles can be replaced for the existing gas nozzles. As the result, the gas flow rate is changed easily in a short time.

The above-mentioned gas nozzles are disposed in the outside direction of the chamber, thereby the operation that the gas nozzles are detached and replaced for other gas nozzles is made easy.

The above-mentioned gas nozzles are provided with means for changing the diameter, thereby it is made possible to control the flow rate of reactive gas jetted from the gas nozzles.

BRIEF DESCRIPTION OF THE DRAWINGS

FIG. 1A is a plan view for illustrating schematically a reactive gas jetting pipe of a conventional and general apparatus for sputtering, FIG. 1B is a cross sectional view along the line 1B—1B shown in FIG. 1A, and FIG. 1C is an enlarged perspective view of an gas nozzle shown in FIG. 1B.

FIG. 3A is a plan view of the reactive gas jetting pipe of the apparatus for sputtering shown in FIG. 2A, FIG. 3B is a cross sectional view along the line 3B—3B shown in FIG. 3A, FIG. 3C is a cross sectional view along the one 3C—3C shown in FIG. 3A, and FIG. 3D is an enlarged cross sectional view of a gauge port type connector shown in FIG. 3C.

FIG. 4 is a cross sectional view of the reactive gas jetting pipe of an apparatus for sputtering in accordance with an embodiment of the present invention in the state that a gas distributor is detached from a gas jetting base.

DETAILED DESCRIPTION OF THE PREFERRED EMBODIMENTS

An embodiment of the present invention will be described in detail hereinafter with reference to the drawings.

Figure 2A:
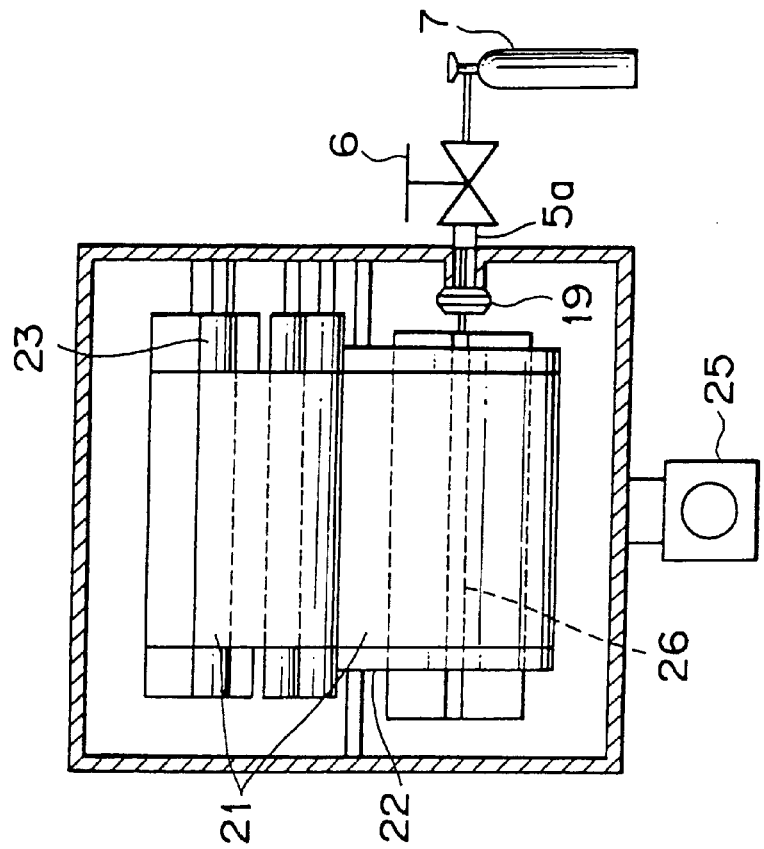
FIG. 2A is a front view for illustrating schematically an apparatus for sputtering with a reactive gas jetting pipe in accordance with an embodiment of the present invention.
Figure 2B:
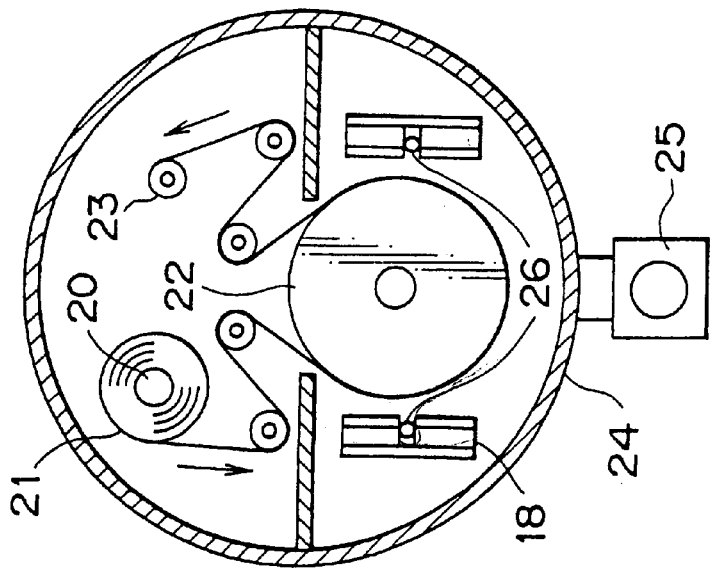
FIG. 2B is a side view for illustrating schematically the apparatus for sputtering shown in FIG. 2A.

FIG. 2A is a front schematic view of an apparatus for sputtering (roll film sputtering machine) provided with a reactive gas jetting pipe in accordance with the present invention, and FIG. 2B is side schematic view of the apparatus for sputtering shown in FIG. 2A.

As shown in FIG. 2A, the apparatus for sputtering has a vacuum chamber 24, and an evacuator 25 for evacuating gas in the chamber is provided outside the vacuum chamber 24. A feeding roller 20, a film forming roller 22, and a taking up roller 23, and a dual magnetron cathode 18 are contained in the vacuum chamber 24. A reactive gas pipe 26 is fixed to the dual magnetron cathode 18.

A roll film 21 set on the feeding roller 20 is subjected to sputtering process using the dual magnetron cathode 18 on the film forming roller 22. The processed roll film 21 is taken up on the taking up roller 23 as a product.

The vicinity of the base end of a reactive gas jetting base 11 described hereinafter of the reactive gas pipe 26 is connected to the pipe connector, i.e., an in-vacuum chamber connector 19, in the same manner as used in the conventional apparatus for sputtering as shown in FIG. 2B. The base end of the reactive gas jetting base 11 is connected to the out-vacuum chamber gas pipe connector 5a. The gas pipe connector 5a is connected to a reactive gas flow rate control valve 6. The reactive gas flow rate control valve 6 is connected to a reactive gas cylinder 7, and the reactive gas cylinder 7 supplies reactive gas to the reactive gas pipe 26. The reactive gas is, for example, oxygen.

FIG. 3A is a plan view of the reactive gas jetting pipe of the apparatus for sputtering shown in FIG. 2A, FIG. 3B is a cross sectional view along the line 3B—3B shown in FIG. 3A, FIG. 3C is a cross sectional view along the line 3C—3C shown in FIG. 3A, and FIG. 3D is an enlarged cross sectional view of the gauge port type connector shown in FIG. 3C.

As shown FIG. 3A, the reactive gas pipe 26 is one component of the dual magnetron cathode 18 comprising a pair of targets 10, and disposed at the center of the pair of targets 10. The reactive gas pipe 26 has a structure that the gas distributor 9 is connected to two gauge port type connectors 13 of the reactive gas jetting base 11 as shown in FIG. 3B.

The reactive gas jetting base 11 comprises an adapter pipe 16, an O-ring 17, an O-ring housing 15, and a screw 14 as shown in FIG. 3D. By attaching the O-ring 17, O-ring housing 15, and screw 14 successively to the adapter pipe 16, the reactive gas jetting base 11 having the gauge port type connector 13 is formed.

The base end of the gas distributor 9 is inserted into the reactive gas jetting base 11, and the screw 14 is screwed. Thereby, the O-ring housing 15 functions to tighten the O-ring 17, as the result, the gas distributor 9 is connected to the reactive gas jetting base 11 and the reactive gas pipe 26 is completed. On the other hand, by unscrewing the screw 14, the gas distributor 9 is detached easily from the reactive gas jetting base 11 as shown in FIG. 4.

There are two O-ring housings 15 and two screws 14 because there are two gauge port type connectors 13. On the gas distributor 9, for example, thirty metal gas nozzles 12 are disposed upward with respect to the pipe (the same direction as the target front side or the outside direction). A gas nozzle 12 is a screw having the same shape as that of a conventional screw shown in FIG. 1C, a hole extends from the base end to the other end for guiding gas through it. By changing the size of this hole as desired, the gas flow rate to be jetted from this hole is controlled. Thereby, the gas flow rate in the longitudinal direction of the reactive gas pipe 26 is controlled, and the film thickness distribution in the transverse direction of sputtering thin film formed on the roll film 21 is controlled, and the film thickness evenness of the sputtering thin film is secured.

In the above-mentioned structure, by connecting the reactive gas jetting pipe base 11 to the reactive gas flow rate control valve 6 outside, it is possible to feed reactive gas to the gas distributor 9. The fed gas is supplied to the cathode from the thirty gas nozzles 12.

According to the above-mentioned embodiment, because the gas nozzles 12 are disposed in the same direction as that of a target front side on the gas distributor 9, after opening the vacuum chamber 24 to the atmosphere, it is possible to detach and replace the gas nozzles 12 without detaching the gas distributor 9. Therefore, the gas flow rate can be changed easily in a short time in comparison with the conventional reactive gas pipe.

The reactive gas pipe 26 comprises the reactive gas jetting base 11 and gas distributor 9, and the reactive gas jetting base 11 and the gas distributor 9 are connected together with the screw 14, the O-ring housing 15, and the O-ring 17. Therefore, the gas distributor 9 itself is detachable easily from the reactive gas jetting base 11 by unscrewing the screw 14. In other words, without detaching the outer structure of the apparatus for sputtering, it is possible to detach easily only the gas distributor 9 which is a component of the internal reactive gas jetting pipe. Therefore, a gas distributor having a set of gas nozzles with hole diameter distribution is previously prepared, and this gas distributor is replaced for a current gas distributor. As the result, the gas flow rate can be changed easily in a short time in comparison with the conventional reactive gas pipe. In other words, the film thickness distribution in the transverse direction of the apparatus for sputtering can be changed very simply.

What is claimed is:

1. An apparatus for sputtering which comprises:
    a pipe, disposed in a chamber, and to which a reactive gas is supplied, said pipe having a plurality of gas nozzles from which said reactive gas is jetted;
    a dual magnetron cathode comprising a pair of targets, each target of said pair of targets having a front face, said reactive gas pipe being axially disposed at a center of the pair of targets behind each front face of each target, with each nozzle of said plurality of gas nozzles facing toward a substrate surface and being disposed in the same direction as each front face of each target; and
    a connector for detaching said pipe, said connector being provided in said chamber.

2. An apparatus for sputtering as claimed in claim 1, wherein each gas nozzle of said plurality of gas nozzles is directed in an outside direction of said chamber.

3. An apparatus for sputtering as claimed in claim 1, wherein said plurality of gas nozzles includes means for changing a jetting diameter.

4. An apparatus for sputtering as claimed in claim 1, wherein each gas nozzle of said plurality of gas nozzles comprises a screw having a hole for jetting said reactive gas.

5. An apparatus having a chamber, a magnetron cathode within said chamber, and a film roll subjected to a sputtering process, comprising:
    a reactive gas pipe having a plurality of gas nozzles in said chamber;
    a source of reactive gas supplied to said reactive gas pipe for jetting said reactive gas from said plurality of gas nozzles;
    a dual magnetron cathode comprising a pair of targets, each target of said pair of targets having a front face, said reactive gas pipe being axially disposed at a center of the pair of targets behind each front face of each target, with each nozzle of said plurality of gas nozzles facing toward a substrate surface and being disposed in the same direction as each front face of each target; and
    a connector for connecting and disconnecting said pipe provided in said chamber.

6. An apparatus as claimed in claim 5, wherein each gas nozzle of said plurality of gas nozzles is directed in an outside direction of said chamber.

7. An apparatus for sputtering as claimed in claim 5, wherein each gas nozzle of said plurality of gas nozzles includes a means for adjusting a gas flow rate.

8. An apparatus as claimed in claim 5, wherein each gas nozzle of said plurality of gas nozzles comprises a screw having a hole for jetting said reactive gas.

9. An apparatus as claimed in claim 5, further including a pair of targets, said reactive gas pipe being axially disposed at a center of the pair of targets.

10. An apparatus as claimed in claim 5, wherein a gas distributor is connected to a pair of connectors of a reactive gas jetting base.

11. An apparatus as claimed in claim 10, wherein said reactive gas jetting base comprises an adaptor pipe, an O-ring, an O-ring housing, and a screw successively attached to said adaptor pipe.

12. An apparatus as claimed in claim 5, wherein said reactive gas pipe comprises a reactive gas jetting base and a gas distributor arranged so that the gas distributor is detachable as a unit to facilitate replacement.

* * * * *